United States Patent
Khan et al.

(10) Patent No.: US 12,018,164 B2
(45) Date of Patent: Jun. 25, 2024

(54) PRINTING SUBSTANCE FOR COATING GLASS SURFACES

(71) Applicant: Ferro GmbH, Frankfurt Am Main (DE)

(72) Inventors: Marya Khan, Langen (DE); Andreas Schulz, Karben (DE); Charlotte Arnold, Darmstadt (DE); Michelle Kühnapfel, Mömlingen (DE)

(73) Assignee: Vibrantz GmbH, Frankfurt (DE)

( * ) Notice: Subject to any disclaimer, the term of this patent is extended or adjusted under 35 U.S.C. 154(b) by 205 days.

(21) Appl. No.: 17/633,656

(22) PCT Filed: Aug. 24, 2020

(86) PCT No.: PCT/EP2020/073593
§ 371 (c)(1),
(2) Date: Feb. 8, 2022

(87) PCT Pub. No.: WO2021/037778
PCT Pub. Date: Mar. 4, 2021

(65) Prior Publication Data
US 2022/0403196 A1      Dec. 22, 2022

(30) Foreign Application Priority Data
Aug. 27, 2019   (DE) .................. 10 2019 123 000.4

(51) Int. Cl.
*C09D 11/38* (2014.01)
*B41M 5/00* (2006.01)
*C03C 17/00* (2006.01)
*C09D 4/06* (2006.01)
*C09D 11/102* (2014.01)
*H05K 3/28* (2006.01)

(52) U.S. Cl.
CPC ........... *C09D 11/38* (2013.01); *B41M 5/0047* (2013.01); *B41M 5/007* (2013.01); *C03C 17/001* (2013.01); *C09D 4/06* (2013.01); *C09D 11/102* (2013.01); *H05K 3/28* (2013.01); *C03C 2218/119* (2013.01)

(58) Field of Classification Search
CPC .................................................. C09D 11/101
See application file for complete search history.

(56) References Cited

U.S. PATENT DOCUMENTS

| | | |
|---|---|---|
| 2006/0019077 A1 | 1/2006 | Hopper et al. |
| 2010/0035003 A1 | 2/2010 | Frances et al. |
| 2010/0068407 A1 | 3/2010 | Jeremic |
| 2014/0031446 A1 | 1/2014 | Lehmann et al. |
| 2017/0298241 A1 | 10/2017 | Park et al. |
| 2020/0095456 A1* | 3/2020 | Choi ............ C08G 59/68 |
| 2020/0157368 A1* | 5/2020 | Park ............ C09D 11/36 |

FOREIGN PATENT DOCUMENTS

| | | |
|---|---|---|
| CN | 106147381 A | 11/2016 |
| DE | 10 349 394 A1 | 5/2005 |
| EP | 2623575 A1 | 8/2013 |
| JP | 2007-270089 A | 10/2007 |
| KR | 2018 0014115 A | 2/2018 |
| WO | 98/43134 A1 | 10/1998 |
| WO | 01/32789 A1 | 5/2001 |
| WO | 2006/056781 A1 | 6/2006 |
| WO | 2007/048819 A1 | 5/2007 |
| WO | 2014/123706 A1 | 8/2014 |
| WO | 2016/048117 A1 | 3/2016 |
| WO | 2018/070654 A1 | 4/2018 |
| WO | 2018/106086 A1 | 6/2018 |
| WO | 2019/132486 A1 | 7/2019 |

OTHER PUBLICATIONS

International Search Report for PCT/EP2020/073593 dated Nov. 26, 2020.
Espacenet Bibliographic data for KR 2018 0014115 A published Feb. 7, 2018, 1 page.
Espacenet Bibliographic data for CN 106147381 A published Nov. 23, 2016, 1 page.
Espacenet Bibliographic data for DE 10349394 A1 published May 25, 2005, 1 page.
Espacenet Bibliographic data for JP 2007-270089 A published Oct. 18, 2007, 1 page.
Espacenet Bibliographic data for WO 98/43134 A published Oct. 1, 1998, 1 page.
Espacenet Bibliographic data for WO 2007/048819 A1 published May 3, 2007 1 page.
Espacenet Bibliographic data for WO 2016/048117 A1 published Mar. 31, 2016, 1 page.
Espacenet Bibliographic data for WO 2018/010608 A1 published Jan. 18, 2018, 1 page.
Espacenet Bibliographic data for WO 2018/070654 A1 published Apr. 19, 2018, 2 pages.
Espacenet Bibliographic data for WO 2019/132486 A1 published on Jul. 4, 2019, 2 pages.

* cited by examiner

*Primary Examiner* — Vu A Nguyen
(74) *Attorney, Agent, or Firm* — Sand, Sebolt & Wernow Co., LPA

(57) ABSTRACT

The present invention relates to a printing substance for coating glass surfaces by way of an ink jet printing method, the printing substance comprising A) at least one monomer having at least one C—C double bond; B) at least one cationically curable monomer comprising epoxy groups; C) at least one cationically curable monomer comprising oxetane groups; D) at least one adhesion agent. In addition, the present invention describes a method for producing the printing substance and the use thereof.

15 Claims, No Drawings

PRINTING SUBSTANCE FOR COATING GLASS SURFACES

CROSS-REFERENCE TO RELATED APPLICATIONS

This application claims priority to PCT Patent Application No. PCT/EP2020/073593 filed 24 Aug. 2020, and to German Patent Application DE 10 2019 123 000.4, filed 27 Aug. 2019, which are hereby incorporated by reference in their entireties.

The present invention relates to printing substances for coating glass surfaces, to a method for producing said printing substances and to a use of these printing substances.

Recently, UV-curing organic inks have been increasingly used instead of the ceramic (inorganic) inks used in the past for printing on glass. This opens the possibility of dispensing with heavy metals, of having available a larger color tint palette (standard and mixed tints), and of achieving greater brilliance and a higher gloss level. An additional advantage is the possibility of evaluating the color tint immediately after the UV curing. In contrast, with inorganic inks, the evaluation is possible only after the tempering. Moreover, said organic inks offer method-related advantages. Thus, a tempering process can be dispensed with, which reduces the method-related costs in comparison to methods with inorganic printing inks. Inorganic printing inks are subjected to a tempering process which in general lasts approximately 90 min and is carried out at a tempering temperature in the range of 500-700° C.

Printing inks and printing methods by means of which decorations on various substrates can be produced are known, for example, from published documents DE 10 349 394 A1, WO 2014/123706 A1, WO 01/32789 A1, US 2017/298241 A1, KR 20180014115, WO 2016/048117, CN 106147381 A, JP 2007270089 A, US 2010/035003 A1, US 2014/031446 A1 and WO 98/43134 A1.

Moreover, there are known printing inks which are applied by way of inkjet printing onto glass bottles in order to produce a decoration. Such printing inks are commercially available from, inter alia, Mankiewicz and Marabu. However, these systems, in order to meet the usual requirements in terms of adhesion, scratch resistance, image accuracy and durability, in particular water or solvent resistance, require a ground coat (primer layer) as well as a protective coating (cover layer).

The known printing inks can be used according to the methods presented above for printing on glass. However, often the applications of a ground coat (primer) to the glass are necessary in order to achieve sufficient adhesion. Without this preliminary treatment, sufficient adhesion is not achieved. In some of the documents presented above, it is claimed that a preliminary treatment with an adhesion promoter would not be necessary. However, these printing inks exhibit adhesion that needs promoting. Furthermore, decorations obtained with known printing inks are not very scratch resistant and they exhibit a relatively low solvent resistance, so that conventional cover layers are applied to a decoration that is obtained.

In view of the prior art, the aim of the present invention then is to provide a printing substance for coating glass surfaces by way of an inkjet printing method, which exhibits high adhesion on a glass substrate, without a ground coat (primer) having to be applied to the glass substrate. Moreover, the printing substance should be curable after a very short time so that the printed glass substrate can be led to its intended use.

In addition, the decoration obtained by the printing substance should have the highest possible solvent resistance and scratch resistance, in particular alcohol resistance and scratch resistance. In particular, the decoration should withstand usual stresses without a protective coating. Furthermore, it should be possible to obtain the printing substance as simply and cost effectively as possible. Furthermore, it should be possible to carry out the printing method involving said printing substance at low cost and high efficiency. In particular, it should be possible to carry out the printing method with highest possible throughput rates, wherein, in particular, short curing times should be achieved. Furthermore, the printing substance should entail the lowest possible maintenance cost on the printing machines. Thus, the printing substance should in particular not lead to readily clogging the printing nozzles in an inkjet printer. Moreover, the decoration that can be obtained by the method should have a high image sharpness. In addition, it should possible to use the printing substance in an inkjet printer.

These problems, as well as other problems which are not explicitly mentioned but which can nevertheless easily be derived or deduced from the contexts discussed herein by way of introduction, are solved by a printing substance having all the features of claim 1. Advantageous variations of the printing substance according to the invention are protected in dependent claims. With regard to the production method and use of the printing substance, the subject matters of claims 19 to 23 provide a solution to the underlying problems.

A subject matter of the present invention is a printing substance for coating surfaces, preferably plastic surfaces or glass surfaces, particularly preferably glass surfaces, by way of an inkjet printing method, comprising
  A) at least one monomer having at least one C—C double bond;
  B) at least one cationically curable monomer comprising epoxy groups;
  C) at least one cationically curable monomer comprising oxetane groups;
  D) at least one adhesion agent.

By this embodiment, plastic surfaces or glass surfaces, preferably glass surfaces, can be printed by way of an inkjet printing method, wherein the decoration obtained exhibits high adhesion on a plastic or glass substrate, preferably a glass substrate, without the plastic or glass substrate, preferably glass substrate, requiring a ground coat. Moreover, after the application, the printing substance can be cured after a very short time so that multiple inks can be printed one after the other, these inks can be printed next to and on top of another, and so that the printed glass substrate can be led to its intended use.

In addition, the decoration obtained by the printing substance exhibits a very high solvent resistance and scratch resistance, in particular alcohol resistance and scratch resistance. In particular, the decoration withstands usual stresses without a protective coating. Surprisingly, a surface hardness which can achieved after a very short time meets the usual requirements that apply in a mechanical filling installation. Thus, a plastic or glass container, preferably a glass container, can be printed on in a filling installation with a printing substance according to the invention and subsequently filled with a fluid without the printing being scratched. A complete curing of the coating, for example, of printed matter, is generally achieved within 24 hours to 5 days, so that the maximum solvent resistance and in particular alcohol resistance is achieved only at a later time.

This is not critical to the extent that the filled containers are only transferred at a later time to the final customers.

Furthermore, the printing substance can be obtained simply and cost effectively, wherein the printing method involving it can be carried out very simply using known machinery. Moreover, the printing method can be carried out with very high throughput rates, wherein in particular very short curing times are achieved. Furthermore, the printing substance allows a very low maintenance cost on the printing machines. Thus, the printing substance in particular does not lead to readily clogging the printing nozzles in an inkjet printer. Moreover, the decoration which can be obtained by the method has a high image sharpness. In addition, the printing substance can be designed for use in an inkjet printer.

The printing substance for coating glass surfaces by way of an inkjet printing method comprises at least one monomer having C—C double bonds as component A). Monomers having at least one C—C double bond are known from the prior art. These monomers can be polymerized via a radical mechanism and/or a cationic mechanism. Here, these monomers can comprise one, two or more C—C double bonds. These monomers include, for example, olefins, vinyl monomers such as vinyl chloride, styrene, vinyl ether monomers, (meth)acrylates, and itaconates.

The preferably used monomers having at least one C—C double bond include (meth)acrylates. (Meth)acrylates are widely known among experts and commercially available. In particular cyclic (meth)acrylates are preferred, particularly preferred are the cyclic (meth)acrylates selected from isobornyl acrylate, t-butylcyclohexyl acrylate, 2-phenoxyethyl acrylate, (5-ethyl-1,3-dioxane-5-yl)methyl acrylate (cyclo-trimethylolpropane formal acrylate). By using (meth)acrylates, in particular cyclic (meth)acrylates, surprising advantages with regard to durability, curability and printing properties of the printing substance can be achieved.

The itaconates are itacone polyester polyols, itacone polyester acrylates or itacone polyester glycidyl methacrylates. Additional information on this subject can be found in the master's thesis of Arjete Hasanaj inter alia: Entwicklung einer UV-härtenden Druckfarbe für Glas aus nachwachsenden Rohstoffen [Development of a UV-Curing Printing Ink for Glass from Renewable Raw Materials], RheinMain University Wiesbaden Rüsselsheim, University of Applied Sciences, Frankfurt am Main, 2013. The published document Arjete Hasanaj: Entwicklung einer UV-hartenden Druckfarbe für Glas aus nachwachsenden Rohstoffen, RheinMain University Wiesbaden Rüsselsheim, University of Applied Sciences, 2013 is incorporated by reference in the present application for disclosure purposes.

Moreover, vinyl ether monomers are included among the preferably used monomers having at least one C—C double bond. Vinyl ether monomers are widely known among experts and commercially available. Preferred are in particular triethylene glycol divinyl ether, diethylene glycol divinyl ether, 1,4-cyclohexane dimethanol divinyl ether, 1,4-butane diol monovinyl ether, 1,4-butanediol divinyl ether and ethylene glycol monovinyl ether. By using vinyl ether monomers, surprising advantages with regard to durability, curability and printing properties of the printing substance can be achieved.

The monomers having at least one C—C double bond according to component A) can be used individually or as a mixture, wherein mixtures are preferred. This includes mixtures of different (meth)acrylates, mixtures of different vinyl monomers, in particular mixtures of different vinyl ether monomers and mixtures of at least one (meth)acrylate and at least one vinyl monomer, preferably a vinyl ether monomer. Here mixtures comprising at least one (meth)acrylate and at least one vinyl ether monomer are preferable.

Preferably, it can be provided that the monomer having at least one C—C double bond represents a monomer mixture which comprises at least one (meth)acrylate and at least one vinyl ether monomer, and the molar ratio of (meth)acrylate to vinyl ether monomer is in the range from 20:1 to 1:20, preferably in the range from 6:1 to 1:6, particularly preferably in the range from 2:1 to 1:2. Monomers having both a (meth)acrylate group and a vinyl ether group are here included with the two monomer types, independently of the number of the respective groups.

Furthermore, the monomer having at least one C—C double bond according to component A) can comprise at least one crosslinking monomer. Radical curable and/or cationically curable monomers according to component A), which bring about a crosslinking, comprise at least two C—C double bonds which can be polymerized via a radical and/or cationic mechanism. Here, the at least two C—C double bonds can have an identical reactivity, such as, for example, 1,4-butanediol divinyl ether, or a different reactivity, such as, for example, vinyl(meth)acrylate. Included among the preferred crosslinked monomers are (meth)acrylates having at least two (meth)acrylate groups and vinyl monomers, preferably vinyl ether monomers having at least two vinyl groups. Here, triethylene glycol divinyl ether, diethylene glycol divinyl ether, 1,4-cyclohexane dimethanol divinyl ether, 1,4-butanediol divinyl ether are preferable inter alia. Especially preferable are mixtures which comprise at least one vinyl monomer, preferably vinyl ether monomer having at least two vinyl groups and at least one non-crosslinking (meth)acrylate.

Furthermore, it can be provided that the monomer having at least one C—C double bond represents a monomer mixture which comprises at least one radical curable monomer and at least one cationically curable monomer. Preferred radical curable monomers having at least one C—C double bond are (meth)acrylates; preferred cationically curable monomers having at least one C—C double bond are vinyl ether monomers. Here, it is known to the person skilled in the art that the vinyl ether monomers can also be cured via a radical mechanism. Therefore, a monomer mixture comprising at least one radical curable monomer and at least one cationically curable monomer represents a mixture with different monomers, the curability of which is different in view of the type of mechanism, i.e., the reaction rate under corresponding conditions (cationic or radical) is different.

Preferably, it can be provided that the monomer having at least one C—C double bond represents a monomer mixture which comprises at least one crosslinking monomer and at least one non-crosslinking monomer, and the molar ratio of crosslinking monomer to non-crosslinking monomer is in the range from 20:1 to 1:20, preferably in the range from 4:1 to 1:6, particularly preferably in the range from 3:2 to 1:2.

The printing substance for coating glass surfaces by way of an inkjet printing method comprises at least one cationically curable monomer having epoxy groups as component B). Cationically curable monomers having epoxy groups are widely known from the prior art and commercially available. Epoxy groups are oxirane residues representing a three-member ring with an oxygen atom. Cationically curable monomers having epoxy groups can be obtained by oxidizing corresponding alkenes with oxygen (epoxidation).

As cationically curable monomers comprising epoxy groups, aliphatic epoxides are preferable. Moreover, as cationically curable monomers comprising epoxy groups, cycloaliphatic epoxides are preferable. Aliphatic and/or cycloaliphatic epoxides preferably contain no heteroaromatic or aromatic groups such as, for example, bisphenol A.

The cationically curable monomer comprising epoxy groups can contain one, two, three or more epoxy groups. Cationically curable monomers comprising epoxy groups to be used according to component B) can be used individually or as mixture, wherein mixtures are preferable. This includes mixtures of different monomers comprising exactly one epoxy group, mixtures of different monomers comprising at least two epoxy groups, and mixtures comprising at least one monomer having exactly one epoxy group and at least one monomer having at least two epoxy groups.

In particular, it can be provided that cationically curable monomers having epoxy groups or respectively components B) contain at least one monomer comprising exactly one epoxy group.

Preferably, it can be provided that the cationically curable monomer having epoxy groups or respectively component B) contains at least one monomer comprising at least two epoxy groups.

Particularly preferably, it can be provided that the cationically curable monomer comprising epoxy groups represents a monomer mixture which comprises at least one crosslinking monomer and at least one non-crosslinking monomer, wherein the molar ratio of crosslinking monomer to non-crosslinking monomer is preferably in the range from 100:1 to 1:5, preferably 10:1 to 1:2. Crosslinking monomers according to component B) have at least two epoxy groups, while non-crosslinking monomers comprise exactly one epoxy group.

Furthermore, it can be provided that the cationically curable monomer comprising epoxy groups comprises at least three epoxy groups. In a particular embodiment, one uses a mixture of cationically curable monomers comprising epoxy groups, which comprises at least one monomer having exactly two epoxy groups and at least one monomer having at least three epoxy groups. Preferably, the molar ratio of monomer having exactly two epoxy groups to monomer having at least three epoxy groups is in the range from 100:1 to 1:4, particularly preferably 10:1 to 1:2.

The printing substance for coating glass surfaces by way of an inkjet printing method comprises at least one cationically curable monomer comprising oxetane groups as component C). Cationically curable monomers having oxetane groups are widely known from the prior art and commercially available. Oxetane groups are residues having a four-member ring containing an oxygen atom. Cationically curable monomers having oxetane groups can be obtained by a Paternò-Büchi reaction from alkenes and carbonyls.

They include inter alia monomers such as bis[1-ethyl(3-oxetanyl)]methyl ether, 3-ethyl-3-hydroxymethyloxetane, 1,4-bis[(3-ethyl-3-oxetanyl)methoxymethyl]benzene, 3-ethyl-3-(phenoxy methyl)oxetane, di[(3-ethyl-3-oxetanyl) methyl] ether, 3-ethyl-3-(2-ethylhexyloxymethyl)oxetane, 3-ethyl-3-cyclohexyloxymethyloxetane. As component C), for example, ARON OXETANE® OXT-101, ARON OXETANE® OXT-121, ARON OXETANE® OXT-211, ARON OXETANE® OXT-221 or ARON OXETANE® OXT-212 can be used, produced by Toagosei Co., Ltd. and the like. The cationically curable monomers having oxetane groups can be used either alone or in combination of two or more.

Preferably, it can be provided that the cationically curable monomer which comprises oxetane groups comprises at least two oxetane groups.

Particularly preferably, it can be provided that the molar ratio of monomer comprising epoxy groups to monomer comprising oxetane groups is in the range from 40:1 to 1:15, preferably 30:1 to 1:10, preferably 25:1 to 1:8, particularly preferably 20:1 to 1:5, especially preferably 10:1 to 1:1, particularly especially preferably 6:1 to 2:1, and most preferably 4:1 to 9:4.

Furthermore, it can be provided that the molar ratio of monomer having at least one C—C double bond to cationically curable monomer having an epoxy and/or oxetane group is in the range from 20:1 to 1:5, preferably 10:1 to 1:3, particularly preferably 5:1 to 1:2, and especially preferably 2:1 to 1:1.

Preferably, it can be provided that the molar ratio of monomer having at least one C—C double bond to monomer comprising epoxy groups is in the range from 20:1 to 1:4, preferably 10:1 to 1:2, particularly preferably 5:1 to 1:1, and especially preferably 3:1 to 3:2.

Particularly preferably, it can be provided moreover that the molar ratio of monomer having at least one C—C double bond to monomer comprising oxetane groups is in the range from 40:1 to 1:2, preferably 20:1 to 1:1, particularly preferably 10:1 to 2:1, and especially preferably 8:1 to 3:1.

As component D), the printing substance for coating glass surfaces by way of an inkjet printing method comprises at least one adhesion agent. Adhesion agents are substances that improve the adhesion of coatings on the substrate. Accordingly, adhesion agents comprise groups and/or residues that bring about a good connection to the substrate, and groups and/or residues that bring about a connection to the coating.

Here, they can be isocyanate adhesion agents, for example, aliphatic isocyanates as well as polyisocyanates, preferably polyisocyanates based on hexamethylene diisocyanate (HDI), trimethylhexane diisocyanate (TMHDI), cycloaliphatic polyisocyanates such as isophorone diisocyanate (IPDI), hydrated xylylene diisocyanate (HXDI) or diisocyanatodicyclohexyl methane (HMDI) as well as aromatic isocyanates such as polyisocyanates, preferably polyisocyanates based on toluene diisocyanate (TDI), xylylene diisocyanate (XDI), tetramethylxylylene diisocyanate (TMXDI) or diisocyanatodiphenyl methane (MDI). Commercially available products are, for example, Desmodur® E41 or Desmodur® N 75 (Covestro). Vinyl phosphates or metalorganic compounds such as titanates or zirconates can also be used.

Preferred groups which bring about a high adhesion to a glass substrate are silane groups inter alia. Preferably, it can be provided that the adhesion agent comprises at least one silane compound, preferably consists of one or more silane compounds.

In order to bring about a good connection to the coating, preferred adhesion agents can be polymerized into the coating. Preferably, it can be provided that the adhesion agent comprises a curable group. Curable groups are residues which react in a polymerization reaction. They include radical polymerizable groups and/or cationically polymerizable groups. Preferably, it can be provided that the adhesion agent is a silane compound having a cationically or radical curable group. The preferred adhesion agents are silane adhesion agents such as vinylsilanes, methacryloxysilanes, epoxysilanes, chlorosilanes and isocyanatosilanes, preferably epoxysilanes.

Preferred silane adhesion agents contain, in addition to a curable group, at least one and preferably at least two hydrolysable groups such as, for example, halogen residues such as chloro or bromo residues and/or alkoxy groups, preferably methoxy, ethoxy, propoxy and/or butoxy groups, wherein methoxy and/or ethoxy groups are preferable.

The preferred epoxysilanes include inter alia 2-(3,4-epoxycyclohexyl)ethyltriethoxysilane, 4-(methyldiethoxysilyl)-1,2-epoxycyclohexane and 3-(3,4-epoxycyclohexyl)propyltri(isobutoxy)silane, (3,4-epoxycyclohexyl)ethyltriethoxysilane, 3-glycidoxypropyldiethoxymethylsilane, 3-glycidoxypropyltri-(isobutoxy)silane, (3,4-epoxycyclohexypethyltri-(isobutoxy)silane, 3-glycidoxypropyltrimethoxysilane and/or 3-glycidoxypropyltriethoxysilane.

Preferably, it can be provided that the printing substance comprises at least 5% by weight, preferably at least 6% by weight, and particularly preferably at least 7% by weight of adhesion agent.

Furthermore, it can be provided that the molar ratio of monomer having at least one C—C double bond to adhesion agent is in the range from 40:1 to 1:2, preferably 20:1 to 1:1, particularly preferably 10:1 to 2:1, and especially preferably 8:1 to 3:1.

Preferably, it can be provided that the molar ratio of cationically curable monomer to adhesion agent is in the range from 20:1 to 1:2, preferably 15:1 to 1:1, particularly preferably 10:1 to 2:1.

Preferably, it can be provided that the molar ratio of monomer comprising epoxy groups to adhesion agent is in the range from 15:1 to 1:2, preferably 10:1 to 1:1, particularly preferably 8:1 to 3:2, and especially preferably 4:1 to 2:1.

Preferably, it can moreover be provided that the molar ratio of monomer comprising oxetane groups to adhesion agent is in the range from 15:1 to 1:15, preferably 10:1 to 1:10, particularly preferably 5:1 to 1:5, and especially preferably 2:1 to 1:2.

The printing substance comprises curable monomers and is cured after the application onto the substrate. Here, the printing substance can be cured preferably by irradiation by electromagnetic waves, particularly preferably by UV radiation, with no limitation intended thereby. Accordingly, the printing substance preferably comprises an initiator, preferably for a cationic curing, and/or a radical initiator. Furthermore, it can be provided that the printing substance comprises at least one photoinitiator which preferably brings about curing with UV radiation. Moreover, it can be provided that the printing substance comprises at least one sensitizer.

The printing substance preferably contains at least one photoinitiator, usually two photoinitiators and possibly three or more photoinitiators, in order to initiate the surface and depth curing (crosslinking) of the ink for printing on glass in UV light. They can be selected from the photoinitiators usually used in UV-curing printing inks and lacquers, etc.

Examples of cationic UV initiators are, for example, aryldiazonium salts, diaryliodonium salts, triarylsulfonium salts, triarylselenonium salts, dialkylphenacylsulfonium salts, aryloxydiarylsulfoxonium salts and diarylphenacylsulfoxonium salts. Preferred examples of cationic UV initiators comprise diphenyl (4-phenylthio) phenylsulfonium hexafloroantimonate, (thiodi-4,1-phenylene) bis(diphenylsulfonium) dihexafluoroatimonate (a mixture of these substances is marketed under the name CHIVACURE® 1176 by Chitec Technology Co. Ltd., Phoenix, Ariz.), diphenyl (4-phenylthio) phenylsulfonium hexafluorophosphate, (thiodi-4,1-phenylene) bis (diphenylsulfonium)dihexafluorophosphate (a mixture of these substances is marketed under the name CHIVACURE®1190 by Chitec Technology Co. Ltd.), triarylsulfonium hexafluorophosphate salt (CYRACURE® UVI-6990) and triarylsulfonium hexafluoroantimonate salt (CYRACURE® UVI-6974) (both available from Union Carbide Chemicals and Plastics Co. Inc., Danbury, Conn.), triphenylselenonium hexafluoroantimonate, triphenyl sulfonium hexafluoroantimonate, triphenyl sulfonium hexafluorophosphate, bis (4-dodecylphenyl)-iodonium hexafluoroantimonate and η-5-2,4-cyclopentadien-1-yl) [(1,2,3,4,5,6-η)-(1-methylethyl)benzene] iron (1+) hexafluorophosphate (1-) (IGRACURE® 261 from Ciba-Geigy Corporation, McIntosh, Ala.), and combinations of two or more of the aforementioned compounds.

Examples of radical UV initiators are, for example, 1-hydroxycyclohexyl phenyl ketone, benzophenone, 2,4,6-trimethylbenzophenone, 4-methylbenzophenone, 2-benzyl-2-dimethylamino-1-(4-morpholinophenyl) butanone, 1,2-methyl-1-(4-methylthio) phenyl-2-(4-morpholinyl)-1-propanone, 2,4,6-trimethylbenzoylphenylphosphinic acid ethyl ester, oligo (2-hydroxy-2-methyl-1-(4-(1-methylvinyl)phenyl) propanone), 2-hydroxy-2-methyl-1-pheny 1-1-propanone, benzyldimethyl ketal, isopropylthioxanthone, 2-methyl-1-[4-methylthiophenyl)-2-morpholinopropan]-1-one (Irgacure® 907 from BASF Corporation or OMNIRAD® 4817 from IGM Resins, Bartlett Ill.), 1-hydroxycyclohexylacetophenone (Irgacure® 184 from BASF Corporation), 2-benzyl-2-dimethylamino-1-(4-morphol inopheny 1)butane-1-one (Irgacure® 369 from BASF Corporation), bis(2,4,6-trimethylbenzoyl)phenylphosphine oxide (Irgacure® 819 from BASF Corporation), 2-hydroxy-2-methyl-1-phenyl-1-propanone (Darocur® 1173 from Ciba), 2-chlorothioxanthone (CTX from Lambson), benzophenone, 2,4,6-trimethylbenzene diphenylphosphine oxide (TPO from BASF or OMNIRAD® TPO from IGM Resins), ethyl-2,4-6-trimethylbenzoylphenyl phosphinate (TPO-L from BASF) and methylbenzoyl formiate (MBF from Lambson), and combinations of two or more of the aforementioned compounds.

The total quantity of photoinitiators is preferably 1 to 12% by weight, preferably 3 to 9% by weight, with respect to the weight of the printing substance.

Furthermore, it can be provided that the printing substance comprises at least one colorant, preferably a pigment and/or a dye, preferably at least one pigment.

The pigments preferably contained in the printing substance according to the invention can be any pigments, for example, titanium dioxide, zinc sulfide, carbon black, azodiaryl yellow, isoindole yellow, diarylide orange, quinacridone magenta, diketopyrrolo red, copper phthalocyanine blue, copper phthalocyanine green, dioxazine violet and diketo metal oxide. A relatively comprehensive list of all additional usable pigments can be found in Color Index International, Fourth Edition Online, 2001, published by the Society of Dyers and Colorists in association with the American Association of Textile Chemists and Colorists. Effect pigments such as metal oxide-coated glitter and metallic pigments can also be used. Precious metal powder or matting agents such as silicates and/or natural and/or synthetically produced filler substances such as, for example, calcium carbonate, barium sulfate, talc, can be used for influencing the physical and chemical properties such as brilliance, hardness, index of refraction, chemical resistance, etc.

The quantity of colored pigment usually is 1 to 40% by weight, preferably 2 to 35% by weight, with respect to the weight of the printing substance, depending on the type of the pigment and the desired covering power. White pigment is usually used in a quantity from 5 to 40% by weight, preferably 10 to 30% by weight.

Surprising advantages can be achieved in that the pigment is dispersed in a curable monomer or oligomer, preferably in a radical or cationically curable monomer or oligomer, particularly preferably a (meth)acrylate.

In general, a printing substance according to the invention can contain additional conventional additives. They include inter alia defoamers, leveling agents, wetting agents, rheology additives and/or stabilizers, preferably in a quantity from 0.1 to 10% by weight, particularly preferably 0.2 to 5, and especially preferably 0.3 to 2.5 by weight, with respect to the total weight of the printing substance. Foam removers can be selected, for example, from modified acrylates or modified acrylate copolymers, but also, and preferably, from silicone-containing compounds. Leveling agents comprise, for example, modified polyacrylates and polysiloxanes.

Rheology additives comprise, for example, compounds based on castor oil, urea, polyurethanes or polyamides.

As stabilizers, Genorad® 16 from the company Rahn, and Fluorstab® UV2 from the company Kromachem, 10, Park Industrial Centre, Tolpits Lane, Watford, Hertfordshire WD1 8SP, UK are preferably used.

Moreover, the printing substance can contain organic solvents and/or water. Thereby, the processability can be improved. On the other hand, organic solvents and/or water are associated with disadvantages. Thus, the curing worsens due to the use of water in the printing substance. Organic solvents are compounds which contain carbon and hydrogen atoms and which evaporate from the coating after the application of the printing substance. Reactive thinners such as components A) to C) which are liquid accordingly are not included among the organic solvents. Organic solvents accordingly do not react by curing with additional components of the printing ink. Preferably, the water proportion of the printing substance is at most 4% by weight, preferably at most 2% by weight, and particularly preferably at most 1% by weight. Particularly preferably, the printing substance comprises no substantial proportions of water. Preferably, the proportion of organic solvent in the printing substance is at most 4% by weight, preferably at most 2% by weight, and particularly preferably at most 1% by weight. Particularly preferably, the printing substance comprises no substantial proportions of solvent.

In a preferred embodiment, the printing substance is suitable for inkjet printing methods (inkjet methods). Therefore, it can be provided that the printing substance, preferably the ink, has a viscosity in the range from 3 mPas to 100 mPas at a shear rate of 600 $s^{-1}$ and 23° C., measured using the cone/plate on the rotation viscosimeter.

In an additional embodiment, the printing substance is suitable for silk screen printing methods. Therefore, it can be provided that the printing substance, preferably the paste, has a viscosity in the range from 1 Pas to 15 Pas at a shear rate of 200 $s^{-1}$ and 23° C., measured with the cone/plate on the rotation viscosimeter.

In an additional embodiment, the printing substance is suitable for spray methods. Therefore, it can be provided that the printing substance, preferably the paste, has a viscosity in the range from 1 mPas to 350 mPas at a shear rate of 200 $s^{-1}$ and 23° C., measured with cone/plate on the rotation viscosimeter.

Preferably, it can be provided that the printing substance comprises at least 60% by weight, preferably at least 70% by weight, particularly preferably at least 80% by weight of components A), B), C) and D).

Preferably, it can be provided that the printing substance comprises at least 70% by weight, preferably at least 80% by weight, particularly preferably at least 90% by weight of solid matter and components A), B), C) and D).

An additional subject matter of the present invention is a UV ink for coating of surfaces, preferably plastic surfaces or glass surfaces, particularly preferably glass surfaces, by way of an inkjet printing method, comprising
  A) at least one monomer having at least one C—C double bond;
  B) at least one cationically curable monomer comprising epoxy groups;
  C) at least one cationically curable monomer comprising oxetane groups;
  D) at least one adhesion agent;
  E) at least one pigment and/or a dye, preferably at least one pigment;
  F) at least one photoinitiator, preferably a UV initiator.

Preferably, it can be provided that the UV ink comprises at least 75% by weight, preferably at least 85% by weight, particularly preferably at least 95% by weight of components A), B), C), D), E) and F).

An additional subject matter of the present invention is a UV ink for coating surfaces, preferably plastic surfaces or glass surfaces, particularly preferably glass surfaces by way of an inkjet printing method, comprising
  A) at least one monomer having at least one C—C double bond;
  B) at least one cationically curable monomer comprising epoxy groups;
  C) at least one cationically curable monomer comprising oxetane groups
  D) at least one adhesion promoter;
  F) at least one photoinitiator, preferably a UV initiator.

Preferably, it can be provided that the UV ink comprises at least 75% by weight, preferably at least 85% by weight, particularly preferably at least 95% by weight of components A), B), C), D) and F).

Particularly preferably, the UV ink comprises a sensitizer. By using sensitizer, a curing by a UV-LED lamp surprisingly can be achieved. LED lamps are highly energy saving in comparison to other lamps, for example, mercury lamps.

A preferred subject matter of the present invention is a UV ink for coating surfaces, preferably plastic surfaces or glass surfaces, particularly preferably glass surfaces by way of an inkjet printing method, comprising
  A) at least one monomer having at least one C—C double bond;
  B) at least one cationically curable monomer comprising epoxy groups;
  C) at least one cationically curable monomer comprising oxetane groups;
  D) at least one adhesion promoter;
  E) at least one pigment and/or one dye, preferably at least one pigment;
  F) at least one photoinitiator, preferably a UV initiator;
  G) at least one sensitizer.

Preferably, it can be provided that the UV ink comprises at least 80% by weight, preferably at least 90% by weight, particularly preferably at least 95% by weight of components A), B), C), D), E), F) and G).

A preferred subject matter of the present invention is a UV ink for coating surfaces, preferably plastic surfaces or glass surfaces, particularly preferably glass surfaces, by way of an inkjet printing method, comprising:
  A) at least one monomer having at least one C—C double bond;
  B) at least one cationically curable monomer comprising epoxy groups;

C) at least one cationically curable monomer comprising oxetane groups;
D) at least one adhesion agent;
F) at least one photoinitiator, preferably a UV initiator;
G) at least one sensitizer.

Preferably, it can be provided that the UV ink comprises at least 80% by weight, preferably at least 90% by weight, particularly preferably at least 95% by weight of components A), B), C), D), F) and G).

UV inks for coating glass surfaces by way of an inkjet printing method which comprise no pigment and/or no dye are particularly suitable for generating relief (colorless elevations) on a substrate.

The aforementioned components A) to F) and A) to G), respectively, have been described in detail above, so that reference is made thereto, wherein the mentioned preferences and preferred embodiments of these components are also applicable to a UV ink.

An additional subject matter of the present invention is a method for producing a printing substance for coating glass surfaces by way of an inkjet printing method. This method is characterized in that components A), B), C) and D) are mixed, preferably components A), B), C), D), E) and F) or A), B), C), D) and F) and particularly preferably components A), B), C), D), E), F) and G) or A), B), C), D), F) and G). In a preferred embodiment of the method according to the invention, preferably a pigment in the form of a dispersion and/or suspension is added, which comprises a monomer, preferably a monomer having at least one C—C double bond.

Furthermore, it can be provided that the printing substance, preferably the UV ink, comprises only small quantities of one or more modifiers. Preferably the printing substance, preferably the UV ink, comprises at most 1% by weight, particularly preferably at most 0.8% by weight of one or more modifiers. Modifiers are in particular polyols having a hydroxyl value from 40 to 330 mg KOH/g; polyols having a hydroxyl value from 40 to 330 mg KOH/g and an acid value of 2 to 20 mg KOH/g; modified rubbers and/or compounds having an epoxy equivalent of 150 to 700 g/mol. Modified rubbers are in particular carboxylated polyisoprenes and/or carboxylated polybutadienes. Particularly preferably the printing substance, preferably the UV ink, comprises no substantial quantities of one or more modifiers.

Furthermore, it can be provided that the printing substance, preferably the UV ink, comprises only small quantities of one or more base generators. Preferably, the printing substance, preferably the UV ink, comprises at most 1% by weight, particularly preferably at most 0.8% by weight of one or more base generators. A base generator is a compound which generates a base when exposed to active radiation, radicals or a base. In particular, base generators are known compounds such as base generators which generate a base during irradiation, base generators which generate a base when exposed to these radicals, and base generators which generate a base when brought in contact with a base. For example, oxime derivatives generate quaternary ammonium salts and quaternary ammonium salts each generate a base when exposed either to active radiation or radicals, and therefore each of these derivatives can be used both as base generator which generates a base when exposed to radiation and also as base generator which generates a base when exposed to these radicals. Carbamate derivatives generate a base when exposed to a base. Particularly preferably, the printing substance, preferably the UV ink, comprises no substantial quantities of one or more modifiers.

Furthermore, it can be provided that the printing substance, preferably the UV ink, comprises only small quantities of one or more alkylene carbonates or butyrolactone. Examples of alkylene carbonates are inter alia glycerin carbonates, ethylene carbonate, propylene carbonate, butylene carbonate and combinations containing at least one of the aforementioned substances. Preferably, the printing substance, preferably the UV ink, comprises at most 1% by weight, particularly preferably at most 0.8% by weight of one or more alkylene carbonates or butyrolactone. Particularly preferably, the printing substance, preferably the UV ink, comprises no substantial quantities of one or more alkylene carbonates or butyrolactone.

Furthermore, it can be provided that the printing substance, preferably the UV ink, comprises only small quantities of one or more acrylate esters of a carboxylic acid ester. Preferably, the printing substance, preferably the UV ink, comprises at most 1% by weight, particularly preferably at most 0.4% by weight of one or more acrylate esters of a carboxylic acid ester. Acrylate esters of a carboxylic acid ester are compounds comprising, in addition to an acrylate group, an ester group, so that the alcohol group of the acrylate also comprises an ester group. Particularly preferably, the printing substance, preferably the UV ink, comprises no substantial quantities of one or more acrylate esters of a carboxylic acid ester.

Furthermore, it can be provided that the printing substance, preferably the UV ink, comprises only small quantities of one or more purely thermal initiators, wherein these thermal initiators can initiate both a radical and also a cationic polymerization. Preferably, the printing substance, preferably the UV ink, comprises at most 1% by weight, particularly preferably at most 0.4% by weight of one or more purely thermal initiators. Purely thermal initiators are compounds which, during heating, can initiate a radical polymerization and/or a cationic polymerization, but which initiate no radical or cationic polymerization when irradiated with UV light. The term "purely thermal initiators" here represents in particular the delimitation with respect to the preferably used UV initiators, so that UV initiators which trigger a polymerization during heating do not represent purely thermal initiators. Particularly preferably, the printing substance, preferably the UV ink, comprises no substantial quantities of one or more purely thermal initiators.

An additional subject matter of the present invention is the use of a printing substance according to the invention, characterized in that the printing substance is applied to glass, ceramic, metal, wood or plastic, preferably to glass or plastic, particularly preferably to glass. The expression "glass," as used in the claims and in the description, is intended to mean glass, ceramic, tile glazes and similar glass like materials.

The objects to be printed on can be in any shape or form, such as a container, a plate, a tile, a figurine, etc. A preferred embodiment of the invention is a packaging glass (beverage bottles, cosmetics containers) and household glass (for example, juice glass).

In a preferred embodiment of the present use, it can be provided that the printing substance is applied by way of an inkjet printing method onto a substrate, preferably onto glass.

In another preferred embodiment of the present use, it can be provided that, after the application of the printing substances (both next to one another and also on top of one another) onto a substrate, preferably onto glass, no additional layer, for example, in the form of a clear cover lacquer, is applied for the protection of the underlying ink.

Furthermore, it can be provided that, before application of the printing substance onto a substrate, preferably onto glass, no layer is applied, and untreated glass is preferably printed on. Moreover, it can be provided that the substrate, preferably the glass, is subjected to a preliminary treatment (flame treatment and/or silane flame treatment). However, a preliminary treatment is not absolutely necessary, as the example data shows.

Moreover, it can be provided that the printing substance is applied in an atmosphere which has a relative air humidity in the range from 25% to 50%.

In addition, it can be provided that the printing substance is applied at a temperature which is in the range from 10 to 60° C., preferably 15 to 55° C. and particularly preferably 20 to 50° C.

The curing of the printing substance is preferably carried out with UV light in a wavelength range from 160 to 420 nm over a timespan sufficient to achieve complete curing. Alternatively, the printing substance can also be cured without photoinitiators and with electron beams. Furthermore, the printing substance can also be provided with thermal initiators and cured accordingly. For the UV curing, conventional UV light sources such as mercury vapor lamps (also iron- or gallium-doped), halogen metal vapor lamps, quartz lamps, excimer lasers or UV light emitting diodes (UV-LEDs) can be used.

Here, the curing can occur via a purely cationic mechanism so that only initiators, preferably photoinitiators, of a cationic reaction are used. In a preferred embodiment, a curing is achieved via a radical and a cationic mechanism, so that both an initiator of cationic polymerization and also an initiator of a radical polymerization are used.

Below, the present invention is explained in further detail in reference to examples, with no limitation of the invention intended thereby.

Test Method
Thumb Rotation Test

The coated glass plate is removed from the belt immediately after UV curing. Using a cloth, applying firm pressure, a rotation movement is performed with the thumb on the freshly cured ink. The resulting impression is evaluated according to the scheme below.

5=detachment of the coating down to the glass
4=strong impression (partway down to the glass)
3=easily discernable impression
2=light impression
1=barely discernable impression, only detectable by reflection of the surface.
0=no impression Cross Cut Test By means of the cross cut tester (blade distance 1 mm), a cross is scratched on the cured surface down to the substrate. Subsequently, an adhesive strip is stuck to the cross intersection, pressed on firmly and then quickly pulled off. The evaluation occurs according to the scheme below from 0 (no loss of adhesion) to 5 (complete detachment).

5=complete detachment also over the cross intersection
4=detachment in the cross intersection
3=30-50% detachment
2=10-30% detachment
1=detachment on the cut <10%
0=no detachment.

Double Rub Ethanol Test

A cloth is secured by cable binder over a hammer weighing 0.5 kg. The cloth is then moistened with ethanol until the cloth is completely soaked. The hammer is moved without pressure (only under its own weight) over the surface. If the cloth dries up, it should be moistened again after 20 to 50 double strokes. The number of double strokes until the coating is affected is recorded.

Cold Water Test

A can is filled with demineralized water. The coated glass plates are positioned in the can so that the coated surface is in open contact with the water. Subsequently, the can is closed and placed for a certain duration in the refrigerator at a temperature between 4 and 10° C.

Pasteurization

A pot is filled with demineralized water. Water is heated to 70° C. The coated glass plates are positioned in the pot so that the coated surface is in open contact with the water. After 30 min, the glass plates are removed and tested.

EMBODIMENT EXAMPLES 1 AND 2 AND COMPARISON EXAMPLES 1 AND 2

The printing substances presented in the following table are prepared by mixing, Preliminary treatment of the plate glass (air side and also bath side): cleaning first with ethanol, then with ethyl acetate.

Application with doctor blade: 8 µm spiral doctor blade from the company BYK

Wet film thickness per layer 8-12 µm. Measured with the wet film thickness measuring device Erichsen model: 234 R/I Lamp: Company Höhnle UV Technology (LED-Powerline PLD), water-cooled, wavelength: 385 nm The dose is 380-420 mJ/cm$^2$, measured with PUK (company Kühnast Strahlungstechnik) UV integrator.

| | Example 1 | Comparison Example 1 | Example 2 | Comparison Example 2 |
|---|---|---|---|---|
| Color | White | White | Cyan | Cyan |
| Components | % by weight | % by weight | % by weight | % by weight |
| Cycloaliphatic epoxide | 6.87 | 7.77 | 8.80 | 9.96 |
| Aliphatic epoxide, glycidyl ether having two epoxy groups | 6.38 | 7.19 | 5.28 | 5.99 |
| Aliphatic epoxide, glycidyl ether having three epoxy groups | 7.56 | 8.34 | 6.65 | 7.53 |

| | | | | |
|---|---|---|---|---|
| Oxetane having two oxetane groups | 6.87 | 7.78 | 8.81 | 10.01 |
| Vinyl ether having one vinyl group | 3.93 | 4.47 | 5.28 | 6.02 |
| Vinyl ether having two vinyl groups | 14.48 | 15.56 | 18.59 | 21.06 |
| Cyclic acrylate (non-crosslinking) | 14.74 | 16.65 | 19.56 | 22.34 |
| Polyvinylbutyral | | | 1.96 | 3.37 |
| Cationic initiator; diaryliodonium salt | 5.89 | 6.66 | 3.67 | 4.14 |
| Sensitizer; UV radical initiator Thioxanthone | 1.97 | 2.22 | 1.22 | 1.39 |
| Silicone-based leveling agent | 0.39 | 0.46 | 0.39 | 0.44 |
| Rheology additive | 1.0 | 1.15 | | |
| Epoxysilanes | 9.84 | | 9.79 | |
| White pigment dispersed in acrylates | 20.07 | 21.76 | | |
| Cyan pigment dispersed in acrylates | | | 10.00 | 7.75 |
| Total | 100.00 | 100.00 | 100.00 | 100.00 |

The coatings obtained on a glass plate are tested by the cross cut test and the double rub ethanol test, wherein the results presented in the following table are achieved:

| | Example 1 | Example 1 | Comparison Example 1 | Comparison Example 1 | Example 2 | Comparison Example 2 |
|---|---|---|---|---|---|---|
| Side of the plate glass | Air side | Bath side | Air side | Bath side | Air side | Air side |
| Cross cut after curing | 0 | 0 | 2-3 | 5 | 0-1 | 3 |
| Double rub ethanol 24 h after curing | >50 | >50 | 30 | 22 | >50 | 25 |

The examples show that, by the addition of adhesion agents, surprising increases in the solvent resistance can be achieved.

EMBODIMENT EXAMPLES 3 AND 4 AND COMPARISON EXAMPLE 3

The printing substances presented in the following table are prepared by mixing, applied by way of inkjet printing onto a glass substrate (plate glass) and cured as presented above:

| | Example 3 | Example 4 | Comparison Example 3 |
|---|---|---|---|
| Color | White | White | White |
| Components | % by weight | % by weight | % by weight |
| Cycloaliphatic epoxide | 9.50 | 7.03 | 9.35 |
| Aliphatic epoxide, glycidyl ether having two epoxy groups | 5.50 | 6.58 | 8.75 |
| Aliphatic epoxide, glycidyl ether having three epoxy groups | 7.23 | 7.72 | 10.26 |
| Oxetane having two oxetane groups | 9.49 | 7.03 | 0.00 |
| Vinyl ether having one vinyl group | 5.51 | 4.08 | 4.08 |
| Vinyl ether having two vinyl groups | 20.37 | 14.72 | 14.72 |
| Cyclic acrylate (non-crosslinking) | | 15.36 | 15.36 |
| Cationic initiator; diaryliodonium salt | 5.99 | 5.70 | 5.70 |
| Sensitizer, UV-radical initiator thioxanthone | 2.00 | 1.90 | 1.90 |
| Silicone-based leveling agent | 0.41 | 0.38 | 0.38 |
| Epoxy silanes; | 10.02 | 9.5 | 9.5 |
| White pigment dispersed in acrylates | | 20.00 | 20.00 |
| White pigment dispersed in cycloaliphatic epoxide and vinyl ether | 23.97 | | |
| Total | 100.00 | 100.00 | 100.00 |

The coatings obtained on a glass plate were tested by the cross cut test and the double rub ethanol test, wherein the results presented in the following table are achieved:

| | Example 3 | Example 3 | Example 4 | Example 4 | Comparison Example 3 | Comparison Example 3 |
|---|---|---|---|---|---|---|
| Side of the plate glass | Air side | Bath side | Air side | Bath side | Air side | Bath side |
| Cross cut after curing | 2-3 | 4 | 0-1 | 2-3 | 3-4 | 5 |
| Cross cut after 30 minutes in water at 70° C. | 2-3 | 5 | 0 | 0-1 | 5 | 5 |
| Double rub ethanol 24 h after curing | 50 | 40 | | | | |

The examples and the comparison example show that, by the use of cationically curable monomers having oxetane groups, substantially higher adhesion strengths can be achieved. Furthermore, printing substances having acrylates exhibit better adhesion strengths than printing substances without acrylates.

EMBODIMENT EXAMPLES 5 TO 9

The printing substances presented in the following table are prepared by mixing, applied by way of inkjet printing onto a glass substrate (plate glass), and cured as presented above:

|  | Example 5 | Example 6 | Example 7 | Example 8 | Example 9 |
| --- | --- | --- | --- | --- | --- |
| Ratio of epoxy to oxetane groups with respect to % by weight | 1:0.33 | 1:1.79 | 1:0.6 | 1:0.14 | 1:2.13 |
| Components | % by weight | % by weight | % by weight | % by weight | % by weight |
| Cycloaliphatic epoxide | 6.23 | 1.33 | 4.67 | 7.79 | 0.85 |
| Aliphatic epoxide, glycidyl ether having two epoxy groups | 5.83 | 1.25 | 4.37 | 7.29 | 0.80 |
| Aliphatic epoxide, glycidyl ether having three epoxy groups | 6.84 | 1.47 | 5.13 | 8.55 | 0.93 |
| Oxetane having two oxetane groups | 9.46 | 24.31 | 14.19 | 4.73 | 25.78 |
| Vinyl ether having one vinyl group | 4.08 | 4.08 | 4.08 | 4.08 | 4.08 |
| Vinyl ether having two vinyl groups | 14.72 | 14.72 | 14.72 | 14.72 | 14.72 |
| Cyclic acrylate (non-crosslinking) | 15.36 | 15.36 | 15.36 | 15.36 | 15.36 |
| Cationic initiator; diaryliodonium salt | 5.7 | 5.7 | 5.7 | 5.7 | 5.7 |
| Sensitizer; UV-radical initiator thioxanthone | 1.9 | 1.9 | 1.9 | 1.9 | 1.9 |
| Silicone-based leveling agent | 0.38 | 0.38 | 0.38 | 0.38 | 0.38 |
| Epoxysilanes; | 9.5 | 9.5 | 9.5 | 9.5 | 9.5 |
| White pigment dispersed in acrylates | 20.00 | 20.00 | 20.00 | 20.00 | 20.00 |
| Total | 100.00 | 100.00 | 100.00 | 100.00 | 100.00 |

The coatings obtained on a glass plate are tested by the cross cut test, wherein the results presented in the following table are achieved:

|  | Example 5 | Example 6 | Example 7 | Example 8 | Example 9 |
| --- | --- | --- | --- | --- | --- |
| Side of the plate glass | Bath side | Bath side | Bath side | Bath side | Bath side |
| Cross cut after curing | 5 | 5 | 5 | 5 | 5 |
| Cross cut 24 hours after curing | 0 | 1.5 | 0 | 0.5 | 0.5 |
| Cross cut after 3 days in cold water (7° C.) | 2 | 5 | 4 | 3 | 5 |

EMBODIMENT EXAMPLES 10 TO 15

The printing substances presented in the following table are prepared by mixing, applied by way of inkjet printing onto a glass substrate (plate glass), and cured as presented above:

|  | Example 10 | Example 11 | Example 12 |
| --- | --- | --- | --- |
| Ratio of epoxy to oxetane groups with respect to % by weight | 1:0.29 | 1:0.33 | 1:1.81 |
| Components | % by weight | % by weight | % by weight |
| Cycloaliphatic epoxide | 9.0 | 8.55 | 1.83 |
| Aliphatic epoxide, glycidyl ether having two epoxy groups | 5.4 | 5.13 | 1.10 |

-continued

| Components | % by weight | % by weight | % by weight |
|---|---|---|---|
| Aliphatic epoxide, glycidyl ether having three epoxy groups | 6.8 | 6.45 | 1.38 |
| Oxetane having two oxetane groups | 9.0 | 10.07 | 25.89 |
| Vinyl ether having one vinyl group | 5.4 | 5.4 | 5.4 |
| Vinyl ether having two vinyl groups | 19.0 | 19.0 | 19.0 |
| Cyclic acrylate (non-crosslinking) | 20.0 | 20.0 | 20.0 |
| Polyvinylbuteral | 3.0 | 3.0 | 3.0 |
| Cationic initiator; diaryliodonium salt | 3.8 | 3.8 | 3.8 |
| Sensitizer; UV-radial initiator thioxanthone | 1.3 | 1.3 | 1.3 |
| Silicone-based leveling agent | 0.4 | 0.4 | 0.4 |
| Epoxysilanes; | 10.0 | 10.0 | 10.0 |
| Cyan pigment dispersed in acrylates | 7.0 | 7.0 | 7.0 |
| Total | 100.00 | 100.00 | 100.00 |

|  | Example 13 | Example 14 | Example 15 |
|---|---|---|---|
| Ratio of epoxy to oxetane groups with respect to % by weight | 1:0.60 | 1:0.14 | 1:2.15 |
| Components | % by weight | % by weight | % by weight |
| Cycloaliphatic epoxide | 6.41 | 10.69 | 1.17 |
| Aliphatic epoxide, glycidyl ether having two epoxy groups | 3.85 | 6.41 | 0.70 |
| Aliphatic epoxide, glycidyl ether having three epoxy groups | 4.84 | 8.07 | 0.88 |
| Oxetane having two oxetane groups | 15.1 | 5.03 | 27.45 |
| Vinyl ether having one vinyl group | 5.4 | 5.4 | 5.4 |
| Vinyl ether having two vinyl groups | 19.0 | 19.0 | 19.0 |
| Cyclic acrylate (non-crosslinking) | 20.0 | 20.0 | 020.0 |
| Polyvinylbutyral | 3.0 | 3.0 | 3.0 |
| Cationic initiator; diaryliodonium salt | 3.8 | 3.8 | 3.8 |
| Sensitizer; UV-radial initiator thioxanthone | 1.3 | 1.3 | 1.3 |
| Silicone-based leveling agent | 0.4 | 0.4 | 0.4 |
| Epoxysilanes; | 10.0 | 10.0 | 10.0 |
| Cyan pigment dispersed in acrylates | 7.0 | 7.0 | 7.0 |
| Total | 100.00 | 100.00 | 100.00 |

The coatings obtained on a glass plate are tested by the cross cut test and the thumb rotation test, wherein the results presented in the following table are achieved:

|  | Example 10 | Example 11 | Example 12 | Example 13 | Example 14 | Example 15 |
|---|---|---|---|---|---|---|
| Side of the plate glass | Bath side | Bath side | Bath side | Bath side | Bath side | Bath side |
| Cross cut after curing | 3 | 3 | 5 | 4 | 3.5 | 5 |
| Cross cut 24 hours after curing | 0 | 0 | 0 | 0 | 0 | 0 |
| Cross cut after 3 days in cold water (7° C.) | 2 | 3 | 5 | 5 | 0 | 5 |
| Thumb rotation test | 1 | 1 | 0 | 0 | 2 | 0 |

EMBODIMENT EXAMPLES 16 AND 17

The printing substances presented in the following table are prepared by mixing, applied by way of inkjet printing onto a glass substrate (plate glass), and cured:

| Components | Example 16 % by weight | Example 17 % by weight |
|---|---|---|
| Cycloaliphatic epoxide | 7.24 | 7.12 |
| Aliphatic epoxide, glycidyl ether having two epoxy groups | 6.73 | 6.61 |
| Aliphatic epoxide, glycidyl ether having three epoxy groups | 7.97 | 7.83 |
| Oxetane having two oxetane groups | 7.24 | 7.12 |
| Vinyl ether having one vinyl group | 4.14 | 4.07 |
| Vinyl ether having two vinyl groups | 14.90 | 14.65 |
| Cyclic acrylate (non-crosslinking) | 15.52 | 15.26 |
| Cationic initiator; diaryliodonium salt | 6.21 | 6.10 |
| Sensitizer; UV-radial initiator thioxanthone | 2.07 | 2.04 |
| Silicone-based leveling agent | 0.41 | 0.41 |
| Rheology additive | 0.66 | 0.71 |
| Epoxysilanes | 10.34 | 10.17 |
| White pigment dispersed in acrylates | 16.57 | 17.91 |
| Total | 100.00 | 100.00 |

The coating composition presented in Example 16 was cured at a relative air humidity above approximately 60% (room temperature), wherein it was cured over a relatively long time period, without an appropriate degree of curing being achieved. The substantially identical composition according to Example 17 was cured at a relative air humidity of approximately 32% (room temperature), wherein a satisfactory curing was achieved in a short time period. Due to the unsatisfactory curing, no tests were carried out with the coating obtained according to Example 16.

| | Example 17 | Example 17 |
|---|---|---|
| Side of the plate glass | Air side | Bath side |
| Cross cut after curing | 0 | 1 |
| Cross cut after 30 minutes in water at 70° C. | 0 | 0 |
| Double rub ethanol 24 h after curing | >100 | >100 |

The examples show that the problems presented above are solved by the present invention, in particular the adhesion and the stability of a decoration obtained by the printing substance according to the invention can be surprisingly clearly increased, without other properties of the printing substance or of the decoration being disadvantageously influenced thereby.

The invention claimed is:

1. A printing substance for coating surfaces, comprising
A) at least one monomer having at least one C—C double bond;
B) at least one cationically curable monomer comprising epoxy groups;
C) at least one cationically curable monomer comprising oxetane groups;
D) at least one adhesion agent,
wherein the molar ratio of the monomer having at least one C—C double bond to adhesion agent is in the range from 40:1 to 1:2, and
wherein the monomer having at least one C—C double bond comprises a (meth)acrylate.

2. The printing substance according to claim 1, wherein the monomer having at least one C—C double bond comprises a mixture comprising at least one (meth)acrylate and at least one vinyl ether monomer.

3. The printing substance according to claim 1, wherein the monomer having at least one C—C bond comprises at least one crosslinking monomer.

4. The printing substance according to claim 1, wherein the adhesion agent comprises at least one silane compound.

5. The printing substance according to claim 1, wherein the printing substance comprises at least 5% by weight of adhesion agent.

6. The printing substance according to claim 1, wherein the cationically curable monomer comprising epoxy groups contains at least one monomer having two epoxy groups.

7. The printing substance according to claim 1, wherein the cationically curable monomer comprising oxetane groups comprises at least one monomer having at least two oxetane groups.

8. The printing substance according to claim 1, wherein the molar ratio of monomer comprising epoxy groups to monomer comprising oxetane groups is in the range from 40:1 to 1:15.

9. The printing substance according to claim 1, wherein the molar ratio of monomer having at least one C—C double bond to cationically curable monomer having an epoxy and/or oxetane group is in the range from 20:1 to 1:5.

10. The printing substance according to claim 1, wherein the proportion of water in the printing substance is at most 4% by weight.

11. The printing substance according to claim 1, wherein the proportion of organic solvent in the printing substance is at most 4% by weight.

12. The printing substance according to claim 1, wherein the adhesion agent comprises a curable group.

13. The printing substance according to claim 1, wherein the printing substance comprises at least 60% by weight of components A), B), C), and D).

14. The printing substance according to claim 1, wherein the printing substance further comprises at least one initiator.

15. The printing substance according to claim 14, wherein the at least one initiator comprises at least one photoinitiator.

* * * * *